(12) United States Patent
Yuzurihara et al.

(10) Patent No.: US 9,590,565 B2
(45) Date of Patent: Mar. 7, 2017

(54) CLASS-D AMPLIFIER

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Ryosuke Ohma, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 14/652,940

(22) PCT Filed: Dec. 26, 2013

(86) PCT No.: PCT/JP2013/084819
§ 371 (c)(1),
(2) Date: Jun. 17, 2015

(87) PCT Pub. No.: WO2015/025440
PCT Pub. Date: Feb. 26, 2015

(65) Prior Publication Data
US 2015/0333708 A1  Nov. 19, 2015

(30) Foreign Application Priority Data
Aug. 22, 2013 (JP) ................... 2013-172073

(51) Int. Cl.
*H03F 3/217* (2006.01)
*H03F 1/08* (2006.01)
(Continued)

(52) U.S. Cl.
CPC ............ *H03F 1/086* (2013.01); *H03F 1/308* (2013.01); *H03F 1/523* (2013.01); *H03F 3/193* (2013.01);
(Continued)

(58) Field of Classification Search
CPC ............... H03F 3/2178; H03F 2200/03; H03F 2200/231; H03F 3/217; H03F 1/086;
(Continued)

(56) References Cited

U.S. PATENT DOCUMENTS

| 5,479,134 A | 12/1995 | Nishioka et al. |
| 6,646,507 B1 | 11/2003 | Prokin et al. |

(Continued)

FOREIGN PATENT DOCUMENTS

| CN | 1305660 A | 7/2001 |
| EP | 1086526 B1 | 6/2003 |

(Continued)

OTHER PUBLICATIONS

International Search Report dated Apr. 1, 2014, issued in corresponding application No. PCT/JP2013/084819 (2 pages).

(Continued)

*Primary Examiner* — Khanh V Nguyen
(74) *Attorney, Agent, or Firm* — Westerman, Hattori, Daniels & Adrian, LLP

(57) ABSTRACT

In a class-D amplifier, oscillation phenomenon is suppressed in a high RF range and surge voltage is reduced. An oscillation absorption circuit is connected on the power supply side of the class-D amplifier circuit, and the class-D amplifier circuit and thus connected oscillation absorption circuit equivalently configure an oscillation circuit. Resistance provided in the oscillation absorption circuit is assumed as damping resistance of the oscillation circuit, thereby suppressing the oscillation phenomenon and reducing the surge voltage. The oscillation absorption circuit is made up of the RL parallel circuit of resistance and inductance. The oscillation absorption circuit and the class-D amplifier circuit constitute the oscillation circuit, and the resistance of the oscillation absorption circuit constitutes the (Continued)

damping resistance of the oscillation circuit in the high RF range.

4 Claims, 15 Drawing Sheets

(51) Int. Cl.
H03F 3/193 (2006.01)
H03F 3/21 (2006.01)
H03F 1/30 (2006.01)
H03F 1/52 (2006.01)
H03F 3/30 (2006.01)

(52) U.S. Cl.
CPC .......... *H03F 3/211* (2013.01); *H03F 3/2171* (2013.01); *H03F 3/2173* (2013.01); *H03F 3/3061* (2013.01); *H03F 3/217* (2013.01); H03F 2200/33 (2013.01); H03F 2200/351 (2013.01); H03F 2200/451 (2013.01); H03F 2200/459 (2013.01); H03F 2203/21106 (2013.01); *H03F 2203/21112* (2013.01)

(58) Field of Classification Search
CPC ........ H03F 3/193; H03F 3/211; H03F 3/2171; H03F 2200/451; H03F 2203/21112; H03F 2203/21106
USPC .......................... 330/207 A, 251; 362/17, 41
See application file for complete search history.

(56) References Cited

U.S. PATENT DOCUMENTS

| | | | | |
|---|---|---|---|---|
| 6,985,034 B1* | 1/2006 | Prokin | .................... | H02M 1/44 330/207 A |
| 7,196,575 B2* | 3/2007 | Kim | ..................... | H03F 3/2171 330/251 |
| 8,203,382 B2* | 6/2012 | Maeda | ..................... | H03F 1/30 330/207 A |
| 2002/0037616 A1 | 3/2002 | Fujita | | |
| 2004/0028242 A1* | 2/2004 | Kitamura | ................ | H03F 1/303 381/111 |
| 2008/0218264 A1 | 9/2008 | Kirchmeier et al. | | |
| 2011/0316627 A1* | 12/2011 | Albers | ..................... | H03F 1/52 330/251 |
| 2012/0037616 A1 | 2/2012 | Kitahara et al. | | |
| 2013/0049718 A1* | 2/2013 | Berkhout | .............. | H03F 3/2173 330/251 |

FOREIGN PATENT DOCUMENTS

| | | |
|---|---|---|
| JP | 2002-515665 A | 5/2002 |
| JP | 2003-516014 A | 5/2003 |
| JP | 2006-262121 A | 9/2003 |
| JP | 2006-262121 A | 9/2006 |
| JP | 2008-228304 A | 9/2008 |
| KR | 2001-0043427 A | 5/2001 |
| TW | 324347 U | 12/2007 |
| WO | 2010/050486 A1 | 5/2010 |

OTHER PUBLICATIONS

Written Opinion dated Apr. 1, 2014, issued in corresponding application No. PCT/JP2013/084819 (9 pages).

Notice of Reasons for Refusal dated Dec. 9, 2015, issued in counterpart Korean Application No. 519980593343, with English translation (8 pages).

Office Action dated Mar. 28, 2016, issued in counterpart Chinese Patent Application No. 201380075886.X, with English translation. (8 pages).

Office Action and Search Report dated Mar. 9, 2015, issued in Taiwanese Patent Application No. 103105206, with English translation. (5 pages).

Extended (supplementary) European Search Report dated Oct. 10, 2016, issued in counterpart European Application No. 13891690.3. (9 pages).

* cited by examiner

DC COMPONENT           AC COMPONENT
(PASS THROUGH L)       (PASS THROUGH R)

$\omega_0$  $\omega$  $\omega_n$  $\omega_m$  $\omega$ $= \dfrac{R}{L}$   $=$ DRIVE FREQUENCY   $= \dfrac{1}{CR}$ $\omega_0 \leqq \omega_n$

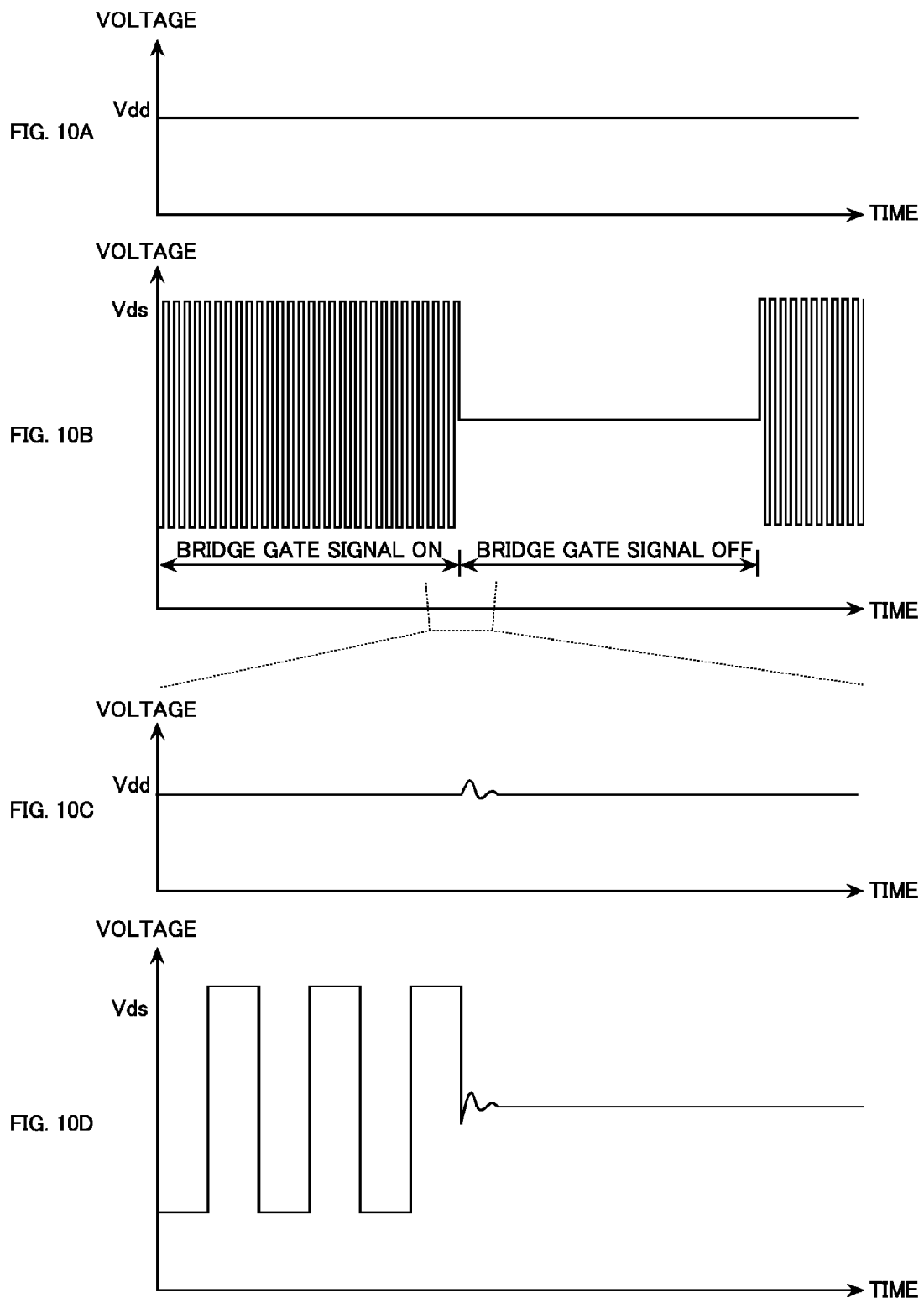

EQUIVALENT CIRCUIT IN ACTIVE STATE (ON → OFF TIME)

DRAIN-SOURCE VOLTAGE OF
CLASS-D AMPLIFIER CIRCUIT IN LOW RF RANGE

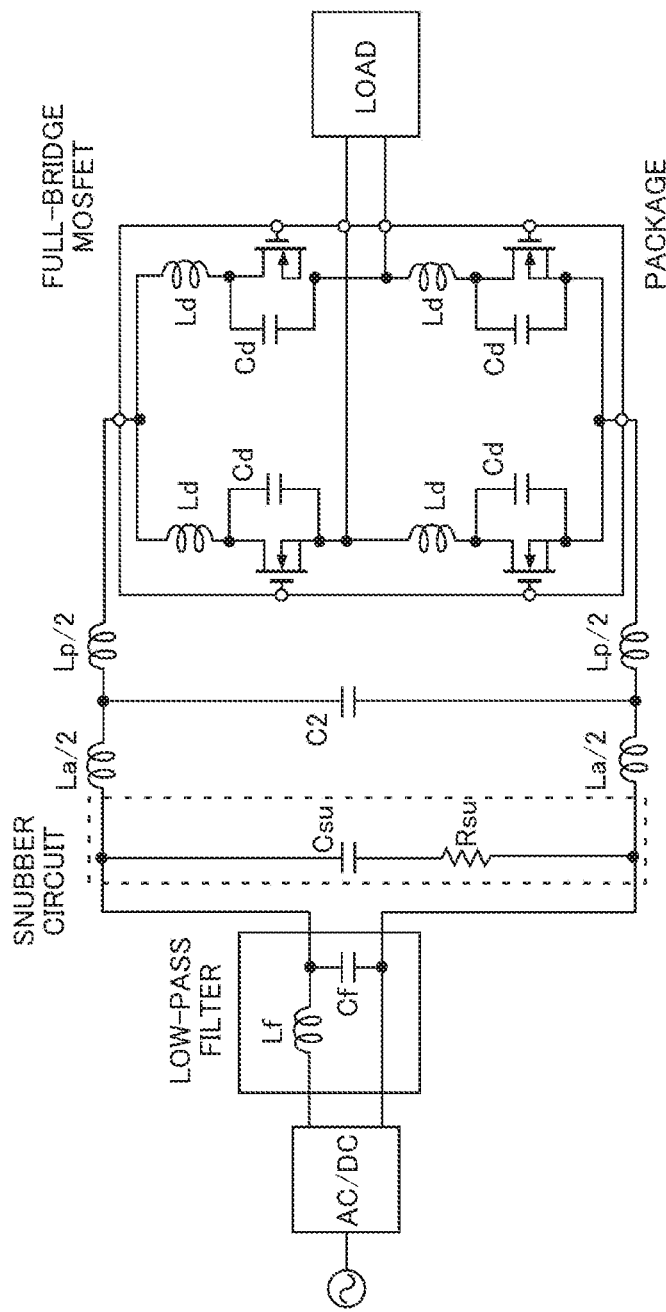
FIG. 13 HIGH-FREQUENCY FULL-BRIDGE CLASS-D AMPLIFIER CIRCUIT

EQUIVALENT CIRCUIT IN HIGH RF BAND

DRAIN-SOURCE VOLTAGE WAVEFORM OF
CLASS-D AMPLIFIER CIRCUIT IN HIGH RF BAND

CLASS-D AMPLIFIER

TECHNICAL FIELD

The present invention relates to a class-D amplifier, and in particular, it relates to a class-D amplifier provided with a full-bridge circuit or a half-bridge circuit that is formed by switching elements.

BACKGROUND ART

There is known a high-frequency power source configured to convert direct current (DC) from a DC power source into high-frequency alternating current (AC), according to switching operation. As one of such high-frequency power sources, a class-D high-frequency power source is known, which is based on the class-D amplifier circuit (Class D: IEC international standard IEC60268-3, 4 classes of operation).

The class-D high-frequency power source incorporates RF power amplifying elements to form a full-bridge circuit or a half-bridge circuit. Then, employing this RF power amplifying element as a switching element, a switching operation is performed using RF gate signals with constant duty cycle, thereby converting direct current from the DC power source into high-frequency alternating current, and supplying to a load, thus obtained high-frequency alternating current serving as high-frequency traveling wave power. The class-D high-frequency power source performs output adjustment, either in the pulse drive mode or in the continuous drive mode. In the pulse drive mode, the RF gate signal causes the RF power amplifying element to perform the switching operation, being provided with ON intervals and OFF intervals alternately; in the ON interval, there is an RF output, and in the OFF interval there is no RF output without performing the switching operation. Then, by changing the duty being a time ratio between the ON interval and the OFF interval, output power of the RF output is adjusted. This duty between the ON interval and the OFF interval may be controlled by the duty between the ON interval and the OFF interval of a pulse control signal. Here, "RF" indicates high frequency.

FIG. 11 illustrates a configuration example of a class-D amplifier circuit for RF band, according to a conventionally known bridge circuit configuration. The example here shows a configuration that switching elements being MOSFETs (Metal-Oxide-Semiconductor Field-Effect Transistors) constitute the full-bridge circuit. The class-D amplifier circuit converts direct current into high-frequency alternating current which is supplied to the load. Here, the direct current is supplied from the DC power supply part, via the wiring inductance La and lead-wire inductance Lp of the lead wire provided on the class-D amplifier circuit package.

In the low RF range where switching frequency is not high, the bypass capacitor $C_2$ is connected between the lead wires outside the package, so as to suppress the surge voltage that is generated at ON/OFF time of the MOSFET.

The surge voltage is suppressed by the bypass capacitor $C_2$ according to the following conditions; in the low RF range, drain-source voltage rise time during the ON time of the MOSFET and the drain-source voltage fall time during the OFF time of the MOSFET are relatively slow going, with small current variation (di/dt) in the MOSFET, and therefore, switching loss in the low RF range of the MOSFET is larger than the switching loss in the high RF band.

In addition, the bypass capacitor $C_2$ is configured to be large, whereby the switching loss in the MOSFET serves as damping resistance, and producing an effect of suppressing resonance phenomenon caused by the wiring inductance La.

FIG. 12A illustrates an equivalent circuit of the class-D amplifier circuit as shown in FIG. 11, when it is switched from ON to OFF. FIG. 12B schematically illustrates the drain-source voltage of the class-D amplifier circuit for the low RF range. In the equivalent circuit, "r" represents the switching loss, "Lp" represents the lead-wire inductance of the package, and "Cd" represents capacitance in the package.

In the low RF range, the characteristic equation for the class-D amplifier circuit may be quadratic, and the attenuation coefficient $\zeta$ is expressed as; $\zeta = r/2 \cdot (2Cd/Ld)^{1/2}$. The switching loss r works as the damping resistance, and attenuates the drain-source voltage oscillation at the time of ON/OFF switching of the MOSFET as shown in FIG. 12B, assuming the attenuation coefficient $\zeta$ as a value larger than 1.

On the other hand, since the MOSFET used for the high RF range where the switching frequency is high operates at high speed, the current variation (di/dt) in the MOSFET becomes large. FIG. 13 illustrates an example of the class-D amplifier circuit for the high RF range. It is to be noted that the circuit surrounded by the broken line in FIG. 13 indicates a snubber circuit which will be described later. FIG. 14A illustrates an equivalent circuit of the class-D amplifier circuit (circuit configuration excluding the snubber circuit) for the high RF range as shown in FIG. 13, when it is switched from ON to OFF. FIG. 14B schematically illustrates the drain-source voltage of the class-D amplifier circuit (circuit configuration excluding the snubber circuit) for the high RF range. The reference "La" in the equivalent circuit represents the wiring inductance outside the package, "Lp" represents the lead-wire inductance of the package, and "Cd" represents the capacitance in the package.

In the high RF range, since the wiring inductance Ld and the capacitance Cd within the package become considerable values, it is not possible for the bypass capacitor $C_2$ provided outside the package to suppress the drain-source surge voltage in the MOSFET.

As illustrated by the equivalent circuit in FIG. 14A, since the switching loss in the high-speed MOSFET is small and the switching loss r does not exist in the class-D amplifier circuit for the high RF range, it does not work as the damping resistance. Therefore, as indicated by C and D in FIG. 14B, it is not possible to produce the effect to suppress oscillation of the drain-source voltage, and thus resonance phenomenon occurs continuously. The reference C in the figure indicates the voltage oscillation state at the time when the switching element is switched from OFF to ON, and the surge voltage is generated. The reference D in the figure indicates the voltage oscillation state at the time when the switching element is switched from ON to OFF. At any of the switching times, thus generated oscillation state may continue until the next switching time.

As shown in FIG. 14B, when surge voltage is generated between drain and source in the MOSFET, there may occur problems that efficiency may be lowered in converting DC to AC, and in addition, excess surge voltage may cause element destruction.

The bypass capacitor $C_2$ connected to the outside the package is not able to absorb the surge energy in the lead-wire inductance Lp and in the wiring inductance Ld in the package, so as to prevent a flow of the surge energy into the MOSFET.

As a measure taken for the high RF range, in addition to providing an isolator, a 3 dB coupler, or the like, on the load side, there is known a configuration that a CR snubber circuit is connected between the supply lines, the CR snubber circuit formed by a series circuit of Csu and Rsu, aiming at suppressing natural oscillation caused by the inductance outside the package.

In addition, a bypass capacitor is connected in parallel, to the series circuit of switching elements constituting the half-bridge circuit within the package, so as to avoid reduction of the supply voltage when current pulses occur at the time of switching, and deter damage on the switching elements due to the current peak (Patent Document 1).

FIG. 15 illustrates a configuration example that the bypass capacitor is connected in parallel to the half-bridge circuit. The bypass capacitor $C_3$ is configured as connected in parallel to the series circuit of the switching elements that constitute the half-bridge circuit.

In the configuration that provides the bypass capacitor within the package of the class-D amplifier, there is a problem that the switching elements and the bypass capacitor form a current path, and the line inductance within the current path and the output capacitance from the switching elements may form an oscillation circuit. Therefore, it is pointed out that application of the class-D amplifier to plasma processes is inadequate (paragraph [0012] in the Patent Document 1). The Patent Document 1 suggests that the length of the current path flowing in the bypass capacitor is restricted, so as to make the inductance smaller and shift oscillation frequencies to higher frequencies, thereby facilitating damping (paragraph in the Patent Document 1).

PRIOR ART DOCUMENT

Patent Document

Patent Document 1
Japanese Unexamined Patent Application Publication No. 2008-228304 (paragraph [0012] and paragraph [0016])

DISCLOSURE OF THE INVENTION

Problem to be Solved by the Invention

In the class-D amplifier for the high RF range, conventionally as described above, there are taken countermeasures such as connecting the bypass capacitor and the snubber circuit outside the package, or connecting the bypass capacitor inside the package, against the problems of surge voltage and resonance phenomenon generated at the time of ON/OFF of the switching elements that form a bridge circuit.

However, in the measure to provide the bypass capacitor outside the package, there is a problem that it is not possible to absorb the energy of the lead-wire inductance Lp of the package and the wiring inductance Ld within the package. When the measure is taken to provide the CR snubber circuit outside the package, there is still a problem that an effect of oscillation absorption may be lost due to the influence of the smoothing capacitor Cf that is provided in the DC power source (FIG. 13).

In the configuration that the bypass capacitor is provided within the package of the class-D amplifier, in order to address the oscillation problem, it is suggested to limit the length of the current path that flows in the bypass capacitor, thereby minimizing the inductance. However, there is a problem that it is difficult to flexibly design the current path in the package of the class-D amplifier, since there is a restriction in arrangement with other elements, and the like.

As described above, the class-D amplifier for the high RF range, being provided with the bridge circuit made up of the switching elements, has a problem of oscillation phenomenon and surge voltage.

If the class-D amplifier for the high RF range is used as an RF power source of a plasma generator, a plasma non-ignition state, an electrical length between the RF power source and a plasma load, and the like, may result in that there is no active component of the load. This may make the attenuation coefficient of the circuit smaller, and large oscillation is liable to occur. Accordingly, in some cases, it may become difficult to use the class-D amplifier.

Here, an object of the present invention is to solve the aforementioned conventional problems, and suppress the oscillation phenomenon in the high RF range and reduce the surge voltage in the class-D amplifier.

Another object of the present invention is to suppress the oscillation phenomenon in the high RF range, without restricting the length of the current path within the package of the class-D amplifier, and reduce the surge voltage.

Means to Solve the Problem

In view of the problems above, in the present invention, an oscillation absorbing circuit is connected to the power source side of the class-D amplifier circuit, equivalently configuring an oscillation circuit by the class-D amplifier circuit and the oscillation absorbing circuit being connected thereto, and resistance provided in the oscillation absorption circuit is assumed as damping resistance of the oscillation circuit, thereby suppressing the oscillation phenomenon and reducing the surge voltage.

The class-D amplifier of the present invention incorporates the class-D amplifier circuit and the oscillation absorption circuit. The class-D amplifier circuit is provided in a package, with a bridge circuit including at least one series circuit of switching elements, and a bypass capacitor connected in parallel to the series circuit of the switching elements in the bridge circuit, and the oscillation absorption circuit is connected to a power input terminal of the class-D amplifier circuit.

The oscillation absorption circuit may be connected to either one of the power input terminal on the positive voltage side and the power input terminal on the negative voltage side of the class-D amplifier circuit, or it may be connected to each of the power input terminals of both on the positive voltage side and the negative voltage side of the class-D amplifier circuit.

The oscillation absorption circuit is configured as an RL parallel circuit containing resistance and inductance. The oscillation absorption circuit and the class-D amplifier circuit being connected configure the oscillation circuit, and the resistance of the oscillation absorption circuit serves as attenuating resistance of the oscillation circuit in the high RF range.

The inductance configuring the oscillation absorption circuit applies low-frequency components (DC components) being lower than the resonance frequency of the oscillation absorption circuit, to the class-D amplifier circuit. Application of the low-frequency components via the inductance may allow the oscillation absorption circuit to supply the low-frequency components (DC component) to the class-D amplifier circuit, without occurrence of power loss due to a resistance component.

On the other hand, the resistance or an RC series circuit incorporating resistance and capacitor, configuring the oscillation absorption circuit, may apply to the class-D amplifier circuit, high-frequency components being equal to or higher than the resonance frequency of the oscillation absorption circuit. The oscillation absorption circuit applies to the class-D amplifier circuit, the high-frequency components (AC components) equal to or higher than the resonance frequency, thereby allowing the resistance R of the oscillation absorption circuit to work as damping resistance that attenuates the oscillation caused by the oscillation phenomenon in the class-D amplifier circuit.

Therefore, the oscillation absorption circuit according to the present invention is able to substantially implement a resistance component, by the circuit that is connected to the outside of the package, without adjusting the package configuration of the class-D amplifier circuit, the resistance component that is used in power consumption necessary for attenuating oscillation in the high RF range including the resonance frequency components.

Configuration Example of the Oscillation Absorption Circuit

When the class-D amplifier circuit is active, a current path is formed within the class-D amplifier circuit, assuming the ON-state switching elements as a part of the path, and the wiring impedance on this current path and the bypass capacitor being connected in parallel form a resonant circuit. Here, the wiring impedance is represented by the series circuit of the wiring inductance and the capacitance between the drain and source of the switching element.

The resistance of the oscillation absorption circuit connected to the class-D amplifier circuit, is connected equivalently in parallel to the resonant circuit formed in the class-D amplifier circuit, thereby constituting the oscillation circuit. The resistance configures attenuating resistance of the oscillation circuit, suppresses the oscillation phenomenon in the high RF range, and reduces the surge voltage.

A resistance value of the resistance constituting the oscillation absorption circuit is set assuming a value of the bypass capacitor as a parameter. More specifically, in the oscillation circuit being the second order oscillation system, which is represented equivalently by an RLC parallel circuit, incorporating the resistance of the oscillation absorption circuit, the bypass capacitor in the class-D amplifier circuit, and the wiring impedance formed by the series circuit of the wiring inductance and the capacitance of the switching element in the class-D amplifier circuit, a value of the resistance in the oscillation absorption circuit may be set on the basis of the value obtained by dividing a product of the attenuation coefficient and the resonance frequency, by the value of the bypass capacitor.

A value of the resonance frequency of the oscillation circuit corresponds to a reciprocal value of the square root of the product of the wiring inductance and the capacitance of the switching element, constituting the wiring impedance of each arm in the bridge circuit.

Class-D Amplifier Circuit

The bridge circuit of the switching elements constituting the class-D amplifier circuit may be a half-bridge circuit made up of a series circuit of two switching elements, or alternatively, it may be a full-bridge circuit formed by connecting the series circuits of two switching elements in parallel.

In any of the bridge circuits; the half-bridge circuit and the full-bridge circuit, a similar resonant circuit is formed on the current path at the ON time of the switching elements, and therefore the class-D amplifier of the present invention to which the oscillation absorption circuit is connected operates in the similar manner.

Effect of the Invention

As explained so far, according to the class-D amplifier of the present invention, it is possible to suppress the oscillation phenomenon in a high RF range of the class-D amplifier, and reduce surge voltage. In addition, it is possible to suppress the oscillation phenomenon and reduce the surge voltage in the high RF range, without limiting the length of the current path in the class-D amplifier package.

BRIEF DESCRIPTION OF DRAWINGS

FIG. 10 illustrates the second embodiment of the present invention;

FIG. 13 illustrates an example of the class-D amplifier circuit for a high RF range;

BEST MODE FOR CARRYING OUT THE INVENTION

Figure 2:
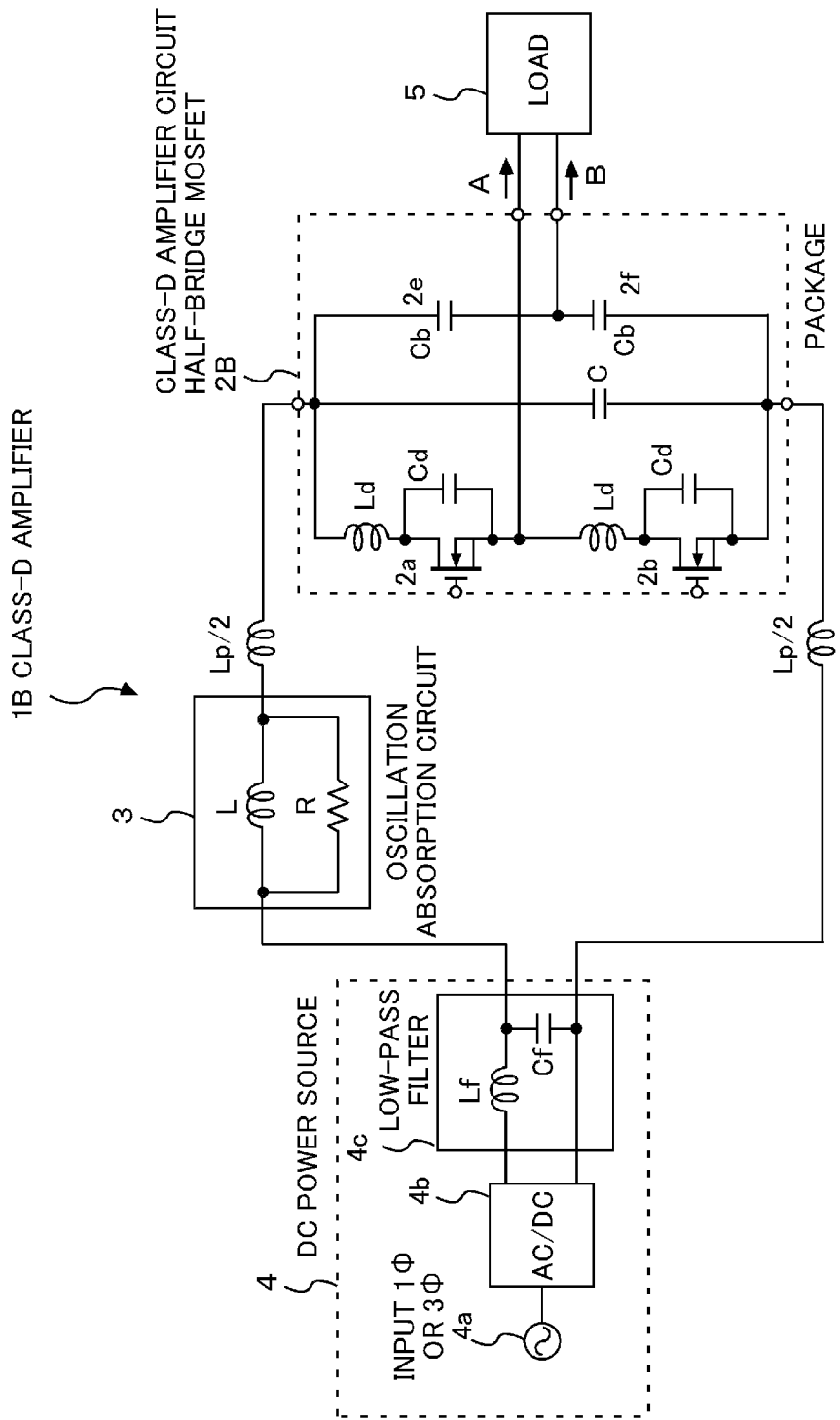
FIG. 2 illustrates a second configuration example of the class-D amplifier according to the present invention.
Figure 3:
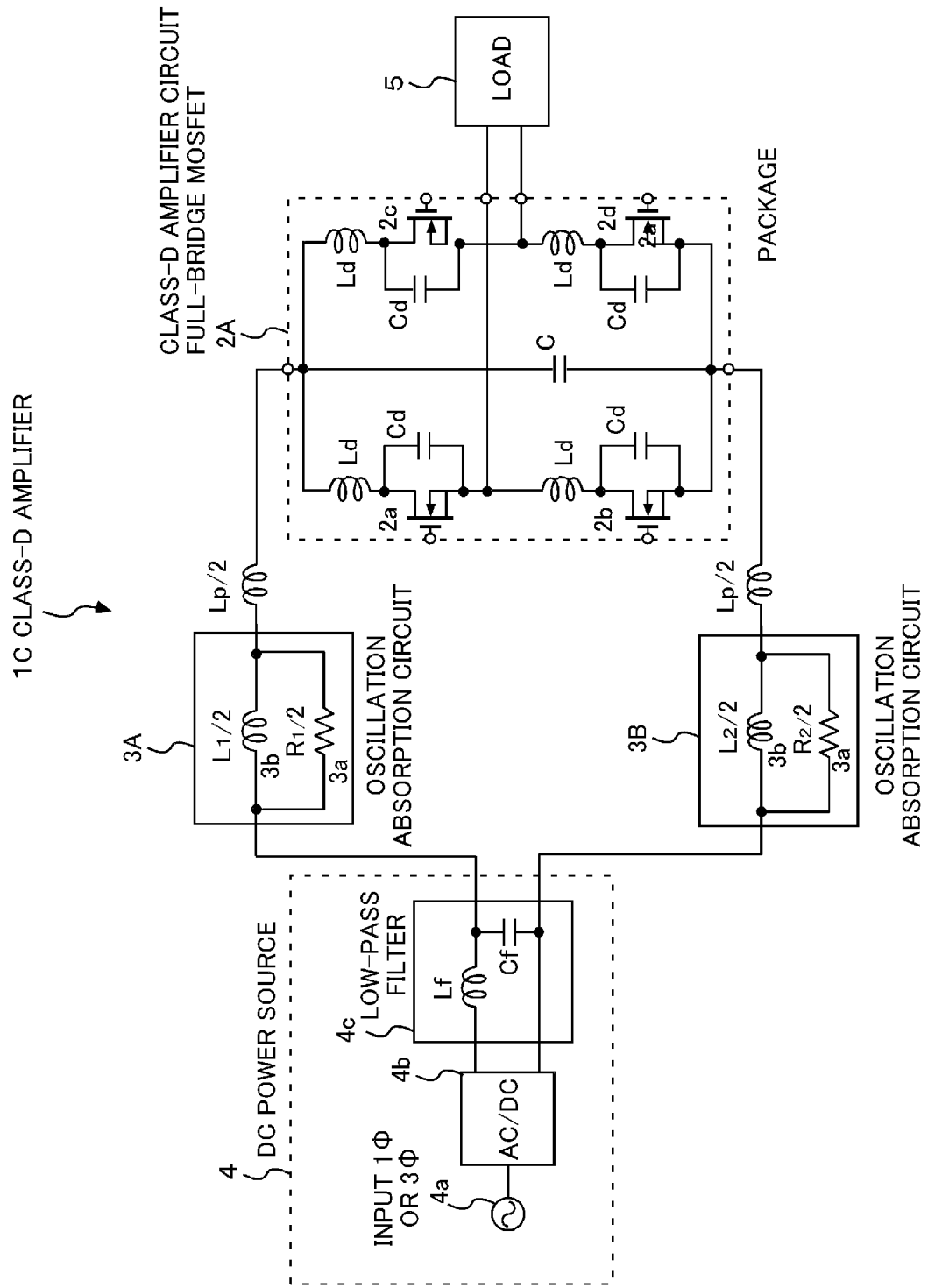
FIG. 3 illustrates a third configuration example of the class-D amplifier according to the present invention.
Figure 4:
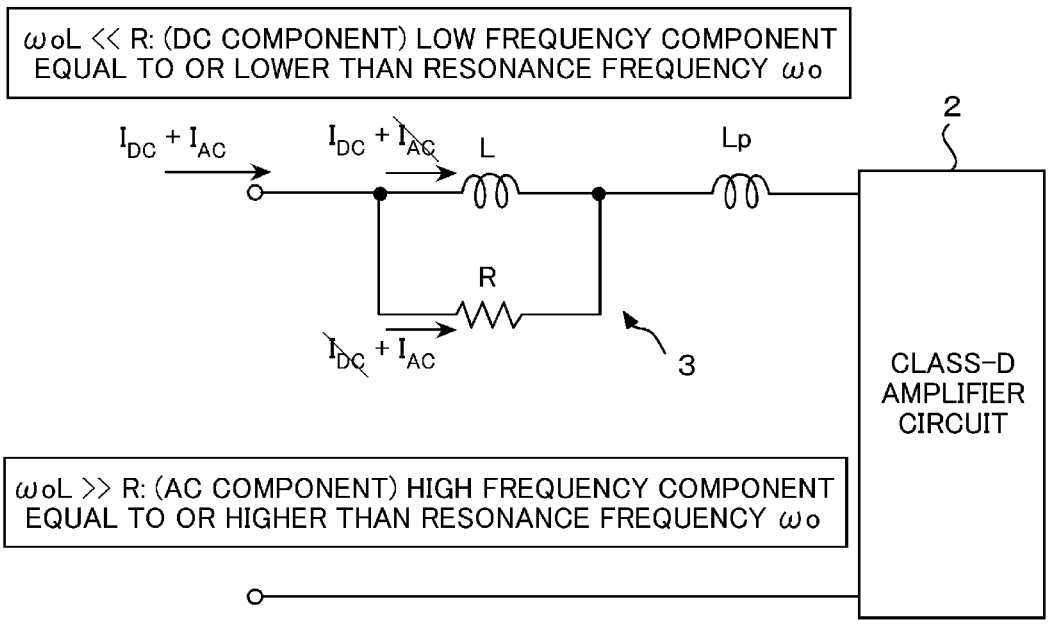
FIG. 4 illustrates a configuration example of the oscillation absorption circuit according to the present invention.

Hereinafter, with reference to the accompanying drawings, the preferred embodiments of the present invention will be explained in detail. In the following descriptions, for explaining the class-D amplifier of the present invention, FIG. 1, FIG. 2, and FIG. 3 illustrates configuration examples of the class-D amplifier, FIG. 4 illustrates a schematic configuration of the oscillation absorption circuit of the present invention, FIG. 5, FIG. 6, and FIG. 7 illustrate examples for setting L and R of the oscillation absorption circuit, and the bypass capacitor C, and FIG. 8, FIG. 9, and FIG. 10 illustrate examples for carrying out the invention.

Configuration Example of the Class-D Amplifier

First Configuration Example of the Class-D Amplifier

Figure 1:
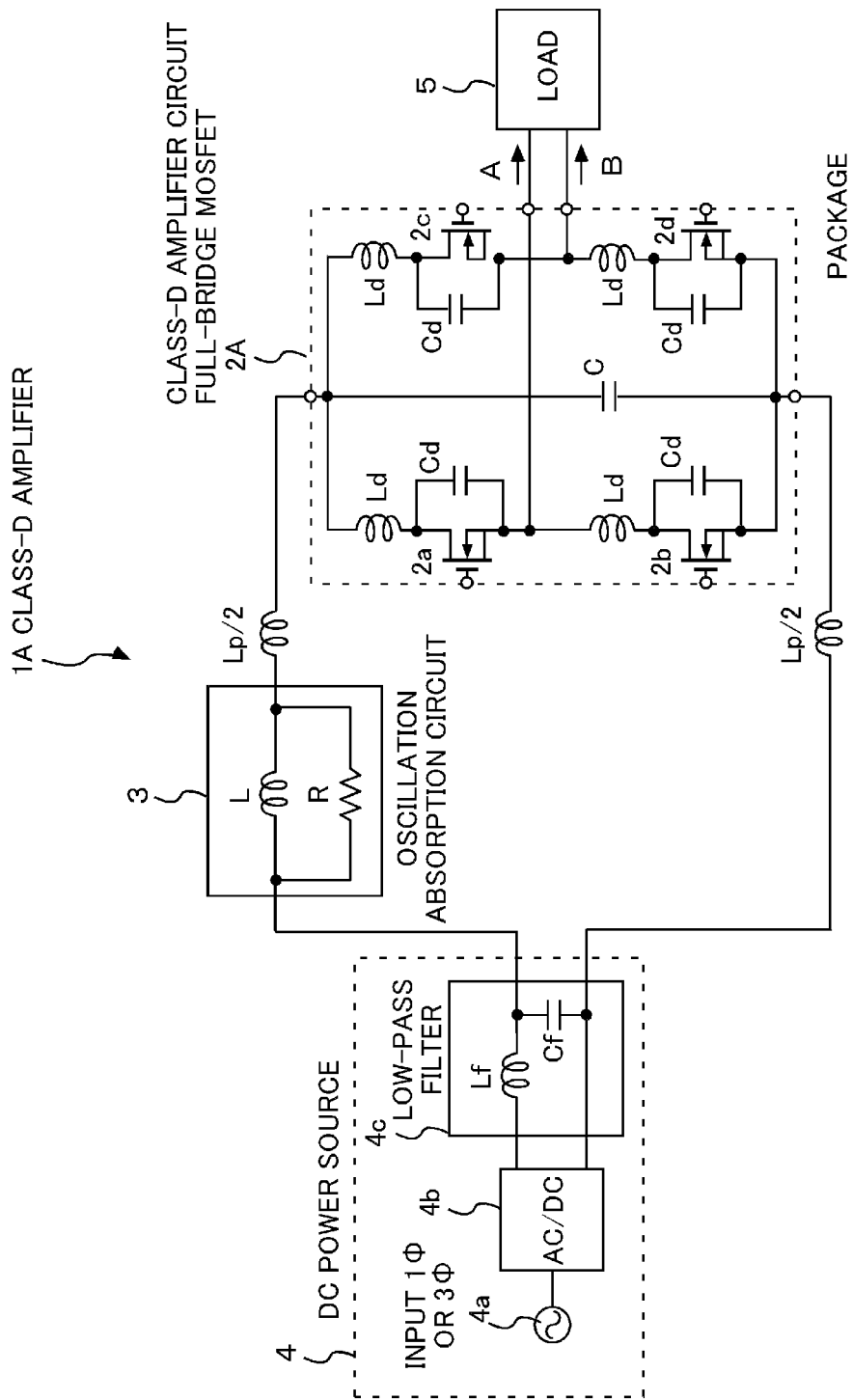
FIG. 1 illustrates a first configuration example of the class-D amplifier according to the present invention.

FIG. 1 illustrates the first configuration example of the class-D amplifier according to the present invention. In FIG. 1, the class-D amplifier 1 is provided with a class-D amplifier circuit 2A, and an oscillation absorption circuit 3 connected to the power input terminal of the class-D amplifier circuit 2A.

The class-D amplifier circuit 2A has a configuration incorporating in an identical package, the full-bridge circuit provided with the series circuit of the switching element 2a and the switching element 2b and the series circuit of the switching element 2c and the switching element 2d, and the bypass capacitor C being connected in parallel to the two series circuits.

The switching elements from 2a to 2d may be configured by MOSFETs, for instance, and the current path to the load 5 is switched according to the ON/OFF control, on the basis of the control signals from the control circuit not illustrated. By way of example, when the switching element 2a and the switching element 2d change state to ON, and the switching element 2b and the switching element 2c change state to OFF, a current path is formed in the direction from the class-D amplifier circuit 2A to the load 5, as indicated by the arrow A. On the other hand, when the switching element 2a and the switching element 2d change state to OFF and the switching element 2b and the switching element 2c change state to ON, a current path is formed in the direction from the class-D amplifier circuit 2A to the load 5, as indicated by the arrow B in the figure. This switching between ON and OFF states of the switching elements may allow inversion of the current direction to be supplied to the load 5.

Since the class-D amplifier circuit 2A has a configuration to arrange the switching elements 2a to 2d via wiring on a substrate within the package, it is provided with wiring impedance caused by the wiring. The wiring impedance is represented, in each of the switching elements constituting the bridge circuit, by the series circuit of the wiring inductance Ld held by the wiring of the switching element and the capacitance Cd of the switching element. The capacitance Cd of the switching element corresponds to a capacitance component between drain and source, in the case of the MOSFET.

The oscillation absorption circuit 3 is connected between the class-D amplifier circuit 2A and the DC power source 4, and supplies DC current from the DC power source 4 to the class-D amplifier circuit 2A. The RL parallel circuit made up of the resistance R and the inductance L configures the oscillation absorption circuit 3.

A lead wire is provided on the power input terminal of the class-D amplifier circuit 2A being connected to the oscillation absorption circuit 3, and an inductance component of the lead wire is represented by the lead-wire inductance Lp in the figure.

The DC power source 4 is a power source to supply direct current obtained by AC/DC conversion to the class-D amplifier 1A. The DC power source 4 is provided with the AC source 4a, the AC/DC converter 4b configured to output direct current via AC/DC conversion, and the low-pass filter 4c configured to exclude high-frequency components from the DC output of the AC/DC converter 4b. The configuration of the DC power source being illustrated is just an example, and it is not limited to this configuration.

Second Configuration Example of the Class-D Amplifier

FIG. 2 illustrates the second configuration example of the class-D amplifier according to the present invention. The first configuration example of the class-D amplifier 1A establishes a full-bridge configuration using the switching elements 2a to 2d in the class-D amplifier circuit 2A, whereas the second configuration of the class-D amplifier 1B establishes a half-bridge configuration using the series circuit of the switching elements 2a and 2b in the class-D amplifier circuit 2B.

The class-D amplifier circuit 2B is provided with the half-bridge circuit made up of the series circuit of the switching element 2a and the switching element 2b and the series circuit of the capacitors 2e and 2f, and the bypass capacitor C being connected in parallel to the series circuit of the switching elements, and those constituent elements are incorporated in an identical package.

The series-connected switching elements 2a and 2b are configured by the MOSFETs, for instance, and the current path flowing in the load 5 is switched according to the ON/OFF control according to control signals from a control circuit, not illustrated. Byway of example, when the switching element 2a changes state to ON and the switching element 2d changes state to OFF, a current path is formed in the direction from the class-D amplifier circuit 2B to the load 5 via the capacitor 2f, as indicated by the arrow A. On the other hand, when the switching element 2a changes state to OFF and the switching element 2b changes state to ON, a current path is formed in the direction from the class-D amplifier circuit 2B to the load 5 via the capacitor 2e, as indicated by the arrow B in the figure. This switching between ON and OFF states of the switching elements may allow inversion of the current direction to be supplied the load 5.

Other configurations of the oscillation absorption circuit 3, the DC power source 4, the load 5, and the lead-wire inductance Lp are the same as those of the class-D amplifier 1A as shown in FIG. 1.

Third Configuration Example of the Class-D Amplifier

FIG. 3 illustrates the third configuration example of the class-D amplifier according to the present invention. The third example of the class-D amplifier 1C corresponds to the configuration that the oscillation absorption circuits 3 are connected respectively to the power input terminal on the positive voltage side of the class-D amplifier circuit and to the power input terminal on the negative voltage side thereof, in the class-D amplifier 1A of the first configuration example or in the class-D amplifier 1B of the second configuration example.

The oscillation absorption circuit 3A is connected between the power input terminal on the positive voltage side of the class-D amplifier circuit 2A, and the positive voltage side of the DC power source 4. The oscillation absorption circuit 3B is connected between the power input terminal on the negative voltage side of the class-D amplifier circuit 2A and the negative voltage side of the DC power source 4. Then, the DC current is supplied from the DC power source 4 to the class-D amplifier circuit 2A. When the RL parallel circuit that configures the oscillation absorption circuit 3 of the first configuration as shown in FIG. 1, is made up of the resistance R and the inductance L, each of the oscillation absorption circuit 3A and the oscillation absorption circuit 3B is established using the RL parallel circuit of the resistance R/2 and the inductance L/2, in order to allow the third oscillation absorption circuits 3A and 3B to similarly produce an oscillation control property.

Each inductance of the lead wire that connects the oscillation absorption circuit 3 with the power input terminal of the class-D amplifier circuit 2A is assumed as Lp/2.

Other configurations of the DC power source 4 and the load 5 are the same as those of the class-D amplifier 1A as shown in FIG. 1.

Configuration of the Oscillation Absorption Circuit

FIG. 4 illustrates a configuration example of the oscillation absorption circuit 3. The oscillation absorption circuit 3 may be connected to either one of the power input terminal on the positive voltage side and the power input terminal on the negative voltage side of the class-D amplifier circuit. Alternatively, it may be connected to each of both power input terminals on the positive voltage side and the negative voltage side of the class-D amplifier circuit.

FIG. 4 illustrates an example that configures the oscillation absorption circuit 3, using the RL parallel circuit of the resistance R and the inductance L. Hereinafter, an explanation will be provided as to the case where the RL parallel circuit of the resistance R and the inductance L configures the oscillation absorption circuit 3.

The oscillation absorption circuit and the class-D amplifier circuit being connected constitute an oscillation circuit, and the resistance of the oscillation absorption circuit establishes attenuating resistance of the oscillation circuit in the high RF range.

The class-D amplifier of the present invention introduces a resistance component equivalently within the class-D amplifier circuit, so as to control generation of the resonance phenomena in the class-D amplifier circuit, and also to promote attention of the oscillation phenomenon. In order to introduce the resistance component R into the class-D amplifier circuit, the class-D amplifier of the present invention uses the oscillation absorption circuit to supply an AC component $I_{AC}$ into the class-D amplifier circuit, in addition to the DC component $I_{DC}$.

The DC current obtained by DC/AC conversion of the DC power source contains an AC component that has passed through the low-pass filter, in addition to the DC component, and the DC components performs major operations of the class-D amplifier circuit. The oscillation absorption circuit 3 feeds the DC component $I_{DC}$ into the class-D amplifier circuit, and simultaneously supplies the AC component $I_{AC}$ in addition to the DC component $I_{DC}$, so as to introduce the resistance R into the class-D amplifier circuit.

The oscillation absorption circuit 3 feeds into the class-D amplifier circuit, a low-frequency component (DC component) being lower than the resonance frequency $\omega_0$ (=R/L) of the oscillation absorption circuit (the RL parallel circuit) via the inductance L, and feeds into the class-D amplifier circuit, a high-frequency component being higher than the resonance frequency $\omega_0$ of the oscillation absorption circuit via the resistance R.

The oscillation absorption circuit 3 feeds into the class-D amplifier circuit 2, a low-frequency component (DC component) being lower than the resonance frequency $\omega_0$ (=R/L) of the oscillation absorption circuit 3 via the inductance L. By feeding the low-frequency component via the inductance L, the oscillation absorption circuit 3 is able to supply the class-D amplifier circuit 2 with the low-frequency component (DC component) without generating power loss due to the resistance R.

On the other hand, a high-frequency component being higher than the resonance frequency $\omega_0$ of the oscillation absorption circuit 3 flows into the class-D amplifier circuit 2, through the resistance R of the oscillation absorption circuit 3, and the oscillation absorption circuit 3 feeds into the class-D amplifier circuit 2, a high-frequency component (AC component) equal to or higher than the resonance frequency $\omega_0$ via the resistance R.

The class-D amplifier circuit 2 is driven at the drive frequency $\omega$ in the high RF range including the resonance frequency of the class-D amplifier circuit. Here, a band of the high-frequency component to be supplied from the oscillation absorption circuit 3 to the class-D amplifier circuit 2 is assumed as the band including the high RF range at the drive frequency $\omega$ of the class-D amplifier circuit 2, thereby allowing the resistance R of the oscillation absorption circuit 3 to work as damping resistance that attenuates the oscillation due to the oscillation phenomenon in the class-D amplifier circuit.

With this configuration, the oscillation absorption circuit 3 is substantially able to implement the resistance component R, without adjusting the arrangement of wiring, and the like, within the class-D amplifier circuit 2 placed in the package, by using the oscillation absorption circuit connected to the outside of the package, the resistance component R being used for power consumption that is necessary to attenuate oscillation in the high RF range including the resonance frequency of the class-D amplifier circuit.

In addition, the resistance R of the oscillation absorption circuit 3 works as the damping resistance in the class-D amplifier circuit, so as to attenuate the oscillation in the high-frequency component including the resonance frequency component of the resonance oscillation of the class-D amplifier circuit, but the resistance R does not generate power loss for the DC component in the oscillation absorption circuit.

Therefore, at the drive frequency in the high RF range including the resonance frequency component of the class-D amplifier circuit, the oscillation absorption circuit 3 of the present invention, being connected to the outside of the package, is substantially able to implement the resistance component to be used for power consumption that is necessary for the oscillation damping, without adjusting the arrangement of the wiring, and the like, of the class-D amplifier circuit within the package.

Setting Example of L and R in the Oscillation Absorption Circuits and the Bypass Capacitor C An explanation will be provided as to L and R in the oscillation absorption circuit and the bypass capacitor C.

The values of L and R in the oscillation absorption circuit may be set according to circuit simulation. In addition, provisional values are calculated with regard to an equivalent circuit that is obtained by approximation, and setting of the L and R values are performed according to the circuit simulation, assuming thus obtained provisional values as initial values. Hereinafter, an explanation will be provided as to an example for calculating the provisional values, on the basis of the equivalent circuit obtained by approximation.

Setting Example

Frequency Range where Lead-Wire Impedance Lp is Negligible

A setting example will be explained in the case where the setting is performed in the frequency range where the lead-wire impedance Lp is negligible. FIG. 5 illustrates a circuit block diagram and an equivalent circuit, for explaining the oscillation absorption circuit and the class-D amplifier circuit.

Figure 5A:
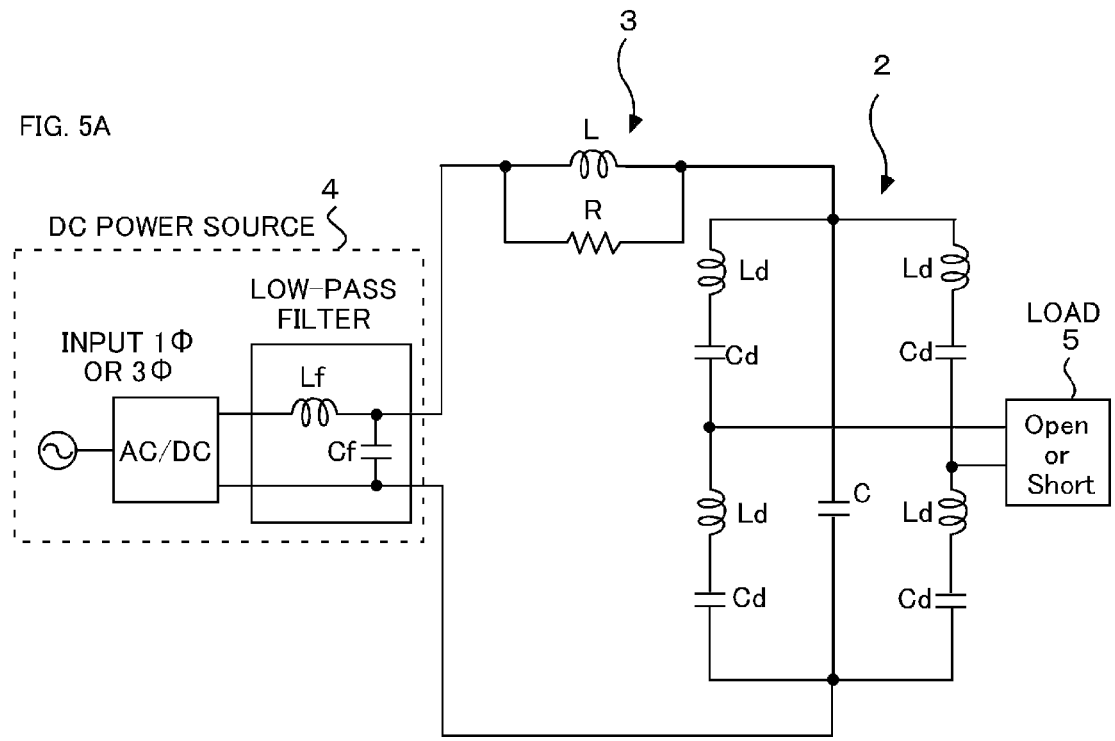
FIG. 5 is a diagram showing a circuit configuration for explaining the oscillation absorption circuit and the class-D amplifier circuit of the present invention.
Figure 6:
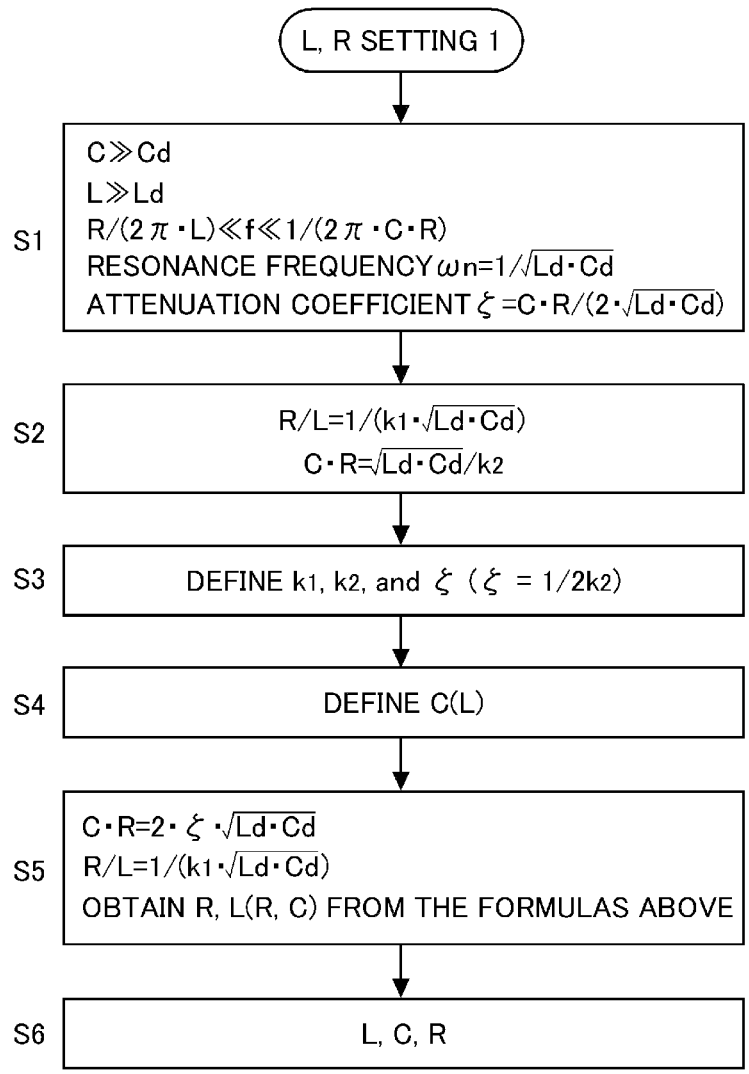
FIG. 6 is a flowchart to explain the setting of L and R of the oscillation absorption circuit according to the present invention.

FIG. 5A illustrates the case where all the switching elements are in the OFF state. When the class-D amplifier is used as an RF power source for a plasma generator, the load 5 serves as plasma load. When the plasma is in a non-ignition state, the load comes into the open state, resulting in that there is no active component. Depending on the electrical length between the class-D amplifier and the electrodes of the plasma generator, the load may come into the open state or into the state of short circuit in the class-D amplifier circuit 2.

When the class-D amplifier circuit 2 is in the active state, a current path is formed within the class-D amplifier circuit via the switching elements in the ON state, and the wiring impedance on the current path and the bypass capacitor being connected in parallel therewith may form a resonant circuit. The wiring impedance includes a series circuit of the wiring inductance Ld and the capacitance Cd between drain and source of the switching element.

Figure 5B:
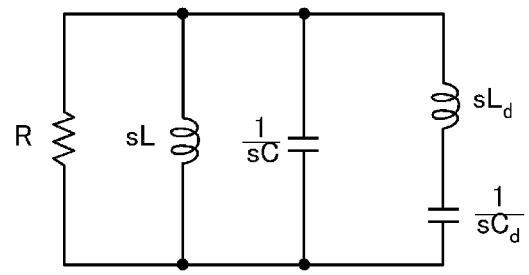

FIG. 5B illustrates the equivalent circuit of the oscillation absorption circuit 3 and the class-D amplifier circuit 2 in the circuit configuration of FIG. 5A. In this example here, when the drive frequency is assumed as ω, the resistance and the inductance of the oscillation absorption circuit are assumed as R and L, respectively, and the lead-wire inductance is assumed as Lp, the lead-wire inductance Lp may be excluded here, by selecting a condition that $\omega \cdot L \gg \omega \cdot Lp$, and $R \gg \omega \cdot Lp$. The state (open state) where there is no active component in the load of the circuit configuration as shown in FIG. 5A is a condition to establish that the attenuation coefficient of the equivalent circuit as shown in FIG. 5B is the smallest and large oscillation is generated.

In the equivalent circuit as shown in FIG. 5B, the resistance R in the oscillation absorption circuit 3 configures the oscillation circuit, by equivalently establishing parallel connection with the resonant circuit that is formed in the class-D amplifier circuit 2. The resistance constitutes damping resistance of the oscillation circuit, suppresses oscillation phenomenon in the high RF range, and reduces surge voltage.

The value of the resistance R constituting the oscillation absorption circuit 3 is set using a value of the bypass capacitor C as a parameter. More specifically, in the oscillation circuit being the second order oscillation system (FIG. 5B), which is represented equivalently by an RLC parallel circuit, incorporating the resistance R of the oscillation absorption circuit 3, the bypass capacitor C in the class-D amplifier circuit 2, and the wiring impedance made up of the series circuit of the wiring inductance Ld and the capacitance Cd of the switching elements in the class-D amplifier circuit 2, the value of the resistance R in the oscillation absorption circuit 3 may be set on the basis of a value obtained by dividing a product of the attenuation coefficient ζ and the resonance frequency ωn, by the value of the bypass capacitor C.

The resonance frequency ωn of the oscillation circuit corresponds to a reciprocal value of the square root of $(Ld \cdot Cd)$, i.e., $(Ld \cdot Cd)^{1/2}$, which is the square root of the product $(Ld \cdot Cd)$ of the wiring inductance Ld and the capacitance Cd of the switching element forming the wiring impedance of each arm in the bridge circuit that constitutes the class-D amplifier circuit.

The relationship above is approximated to the second order characteristic equation described later, by applying the following conditions to the fourth order characteristic equation F that is obtained with regard to the equivalent circuit as shown in FIG. 5B:

$$F = s^4 + \frac{1}{CR}s^3 + \frac{1}{L_d C_d}s^2 + \frac{1}{L_d C C_d R}s + \frac{1}{LL_d C C_d} = 0 \quad (1)$$

Here, the conditions are:

$$C \gg Cd \quad (2)$$

$$L \gg Ld \quad (3)$$

and, as for the drive frequency ω:

$$\omega o = R/L \gg \omega \quad (4)$$

$$\omega \gg 1/(C \cdot R) = \omega m \quad (5)$$

It is to be noted that ωo represents the resonance frequency of the oscillation absorption circuit (RL parallel circuit), ωm represents the resonance frequency of the series circuit of R in the oscillation absorption circuit and the bypass capacitor C. In addition, ω represents the drive frequency, and ωn represents the resonance frequency of the oscillation circuit that is made up of the oscillation absorption circuit and the full-bridge circuit.

$$F = s^2 + \frac{r}{L_p}s + \frac{1}{2L_p C_d} \quad (6)$$

Here, the second order oscillation system is generally expressed by the following formula (7):

$$s^2 + 2\zeta \omega_n s + \omega_n^2 \quad (7)$$

According to the coefficient comparison between the formula (6) and the formula (7), the resonance frequency ωn and the attenuation coefficient ζ of the oscillation circuit are expressed as the following:

$$\omega_n = \frac{1}{\sqrt{L_d C_d}} \quad (8)$$

$$\zeta = \frac{CR}{2\sqrt{L_d C_d}} \quad (9)$$

Here, the resistance R in the oscillation absorption circuit is expressed by the following formula (10):

$$R = \frac{2\zeta \omega_n}{C} \quad (10)$$

A value of the resistance R in the oscillation absorption circuit may be obtained from the wiring inductance Ld, the capacitance Cd of the switching element, and the bypass capacitor C, according to the formulas (8) to (10). The attenuation coefficient ζ may be set to a value smaller than 1, thereby allowing the oscillation to attenuate, and it may be defined in the range approximately from 0.05 to 0.8 as a reference.

The case of a full-bridge circuit with the drive frequency co; i.e., f=40.68 MHz will be taken as an example. Following constants are already given:

L=300 nH
C=720 pF
Ld=20 nH
Cd=125 pF

When it is assumed that $\zeta=0.5$, the damping resistance R becomes 2.2Ω.

Here, the condition of the frequency satisfies the following:

$$R/(2\Pi L) << f << 1/(2\Pi CR) =$$

$$1.2 \text{ MHz} << 40.68 \text{ MHz} < (fn = 100 \text{ MHz}) << 10{,}000 \text{ MHz}$$

With reference to the flowchart in FIG. 6, an explanation will be provided as to the example where it is assumed that L and R are not given, Ld, Cd, and C are already given, and $k_1$, $k_2$, and $\zeta$ are used as parameters, so as to set L and R being unknown.

For the definition on the basis of the aforementioned second order oscillation system, following is assumed as setting conditions:

$$C >> Cd \quad (2)$$

$$L >> Ld \quad (3)$$

$$\omega o = R/L >> \omega \quad (4)$$

$$\omega << 1/(C \cdot R) = \omega m \quad (5)$$

In addition, it is also assumed that the resonance frequency $\omega n$ and the attenuation coefficient $\zeta$ are defined as the following (S1).

$$\omega_n = \frac{1}{\sqrt{L_d C_d}} \quad (8)$$

$$\zeta = \frac{CR}{2\sqrt{L_d C_d}} \quad (9)$$

The setting conditions (4) and (5) are expressed as the following, using the parameters $k_1$ and $k_2$ (S2).

$$R/L = \frac{1}{k1\sqrt{L_d C_d}} \quad (11)$$

$$CR = \frac{\sqrt{L_d C_d}}{k2} \quad (12)$$

The parameters $k_1$, $k_2$, and $\zeta=\frac{1}{2}k_1$) are defined (S3), and a value of the bypass capacitor C is determined. It is to be noted that the value of the bypass capacitor C is set on the basis of the design condition that is necessary for the class-D amplifier circuit (S4).

The values of the parameters $k_1$ and $k_2$ and the bypass capacitor C, are substituted into the formula (8) of the resonance frequency $\omega n$ and the formula (9) of the attenuation coefficient $\zeta$, thereby calculating the resistance R and the inductance L of the oscillation absorption circuit (S5), and setting L, C, and R of the class-D amplifier (S6). It is to be noted that when the inductance L of the oscillation absorption circuit is predetermined in the step S4, the resistance R and the bypass capacitor C of the oscillation absorption circuit may be calculated in the step S5.

Figure 7A:
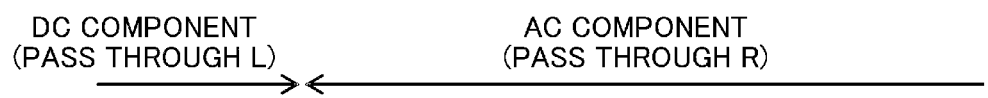
FIG. 7 illustrates the frequency relations in the oscillation absorption circuit and the class-D amplifier circuit according to the present invention.

FIG. 7 illustrates the frequency relationship in the setting example. FIG. 7A illustrates the frequency relationship in the oscillation absorption circuit. The DC component lower than the resonance frequency $\omega o$ of the oscillation absorption circuit (RL parallel circuit) is supplied to the class-D amplifier circuit via the inductance L of the oscillation absorption circuit, and the AC component higher than the resonance frequency $\omega o$ is supplied to the class-D amplifier circuit via the resistance R of the oscillation absorption circuit.

Figure 7B:
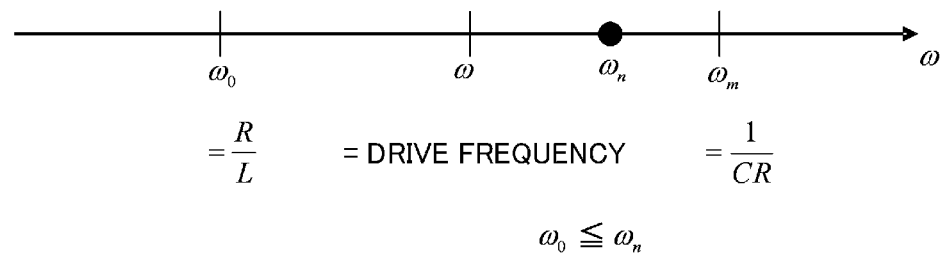

FIG. 7B illustrates the frequency relationship in the class-D amplifier circuit. The drive frequency co is determined on the basis of the cycle of the switching operation of the switching element, and as described above, the frequency range satisfies the conditions $R/L<<\omega<<1/CR$, and $R>>\omega \cdot Lp$.

EXAMPLES

Hereinafter, examples of the present invention will be explained. In the following, the first example and the second example of the present invention are compared with a conventional configuration example, and an explanation will be made as to an effect of suppressing oscillation phenomenon in the high RF range and reducing surge voltage, according to the configuration of the present invention.

The drive frequency and the circuit constant in each of the examples are set as the following;

Drive Frequency $f$ = 40 MHz

Inductance $L$ of the oscillation absorption circuit = 300 nH

Bypass capacitor $C$ = 0 pF (open) (Conventional configuration example)

= 1 μF (First example of the present invention)

= 720 pF (Second example of the present invention)

Wiring inductance $Ld$ of the class-D amplifier circuit = 10 nH

Capacitance $Cd$ of the class-D amplifier circuit = 125 pF

Resistance $R$ of the oscillation absorption circuit =

∞ (open) (Conventional configuration example) =

1.5 Ω (First example of the present invention) =

1.5 Ω (Second example of the present invention)

Load impedance = 26 + j15 Ω

Example According to Conventional Configuration

With reference to FIG. 8, an explanation will be provided as to the DC voltage Vdd, and the drain-source voltage Vds according to the conventional configuration example. The example described here has a conventional configuration that is not provided with the oscillation absorption circuit and bypass capacitor of the present invention.

Figure 8A:
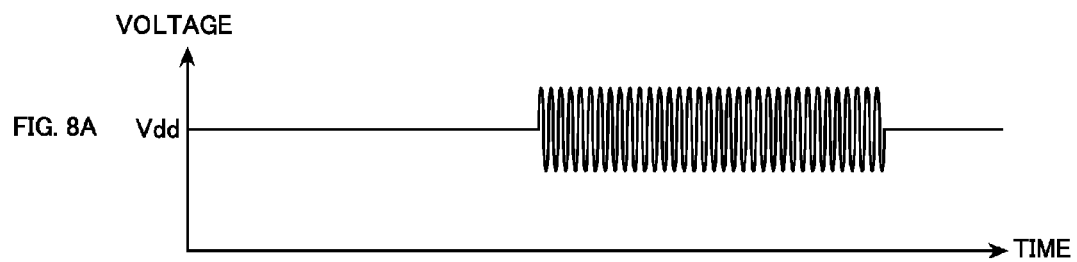
FIG. 8 illustrates an example of a conventional configuration.
Figure 8B:
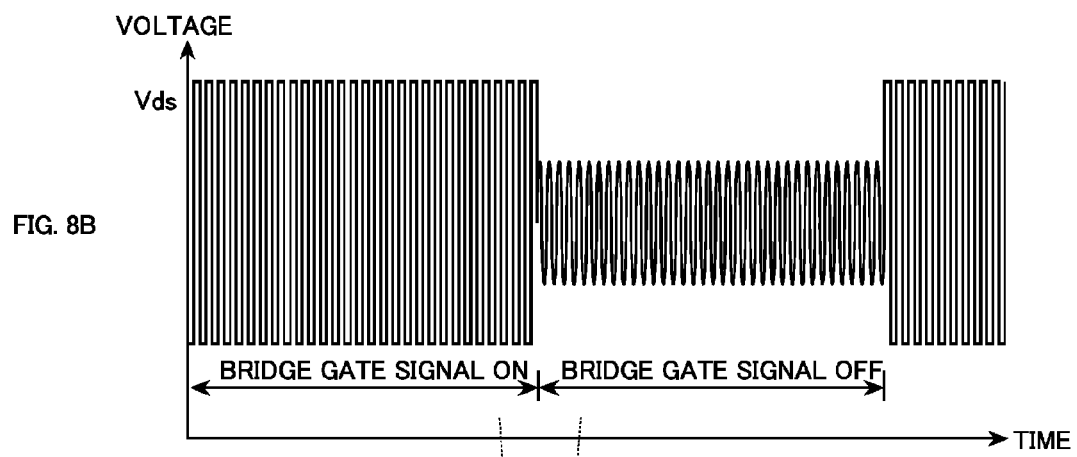
Figure 8C:
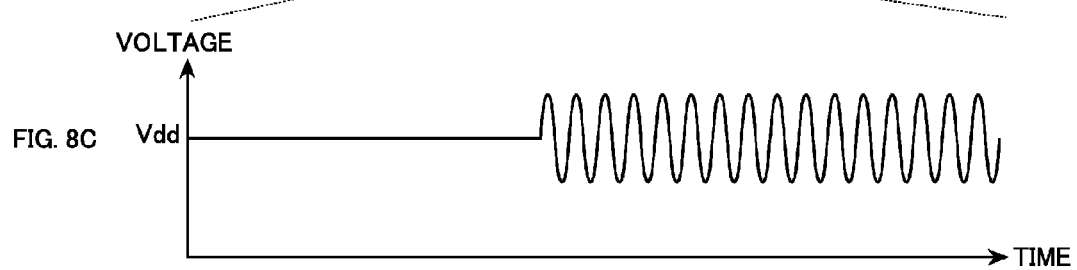
Figure 8D:
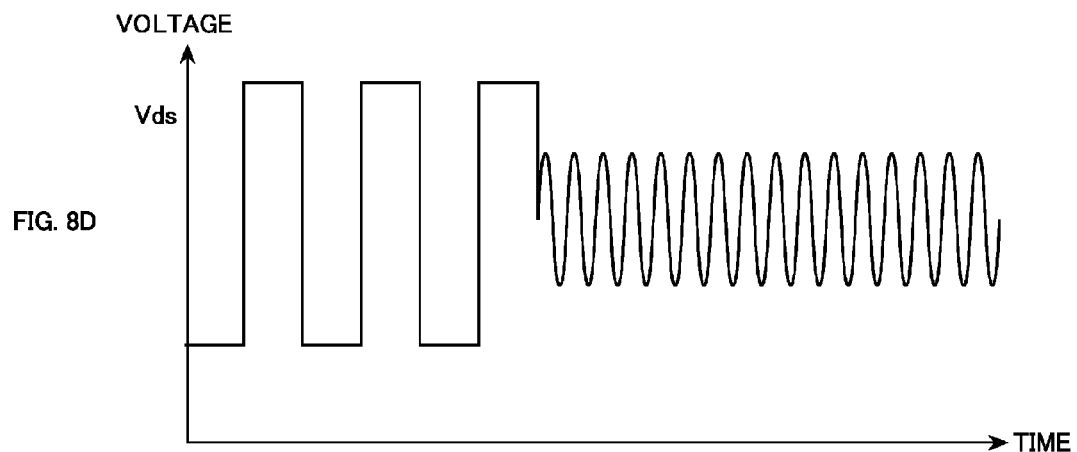

In the example according to the conventional configuration, there are described DC voltage Vdd and drain-source voltage Vds that are applied to the class-D amplifier circuit. FIG. 8A and FIG. 8C illustrate the DC voltage, FIG. 8B and FIG. 8D illustrate the drain-source voltage Vds, and FIG. 8C and FIG. 8D illustrate the state before and after the change of the gate signal from the ON state to the OFF state, on an enlarged scale. It is to be noted here that the cycle of the drive signals; rectangular signal and sine-wave signal as shown in FIG. 8, is illustrated schematically for the purpose of explanation, and it is not illustrated as an actual cycle.

The DC voltage Vdd indicates steady voltage during the ON interval where the gate signal is applied to the bridge circuit, and after the gate signal is switched from the ON state to the OFF state, oscillation occurs as shown in FIG. 8A and FIG. 8C.

During the ON interval where the gate signal is applied, a rectangular drive signal is applied to the switching element, and switching operation of the switching element is performed. When the drive signal is applied, the drain-source voltage Vds is illustrated as a rectangular periodic signal.

After the gate signal is switched to the OFF state, application of the drive signal is suspended, in order to stop the switching operation of the switching element. It is desirable that this suspension of the drive signal stops the periodic signal of the drain-source voltage Vds. However, in the conventional configuration, the oscillation absorption circuit and the bypass capacitor are not provided, and therefore, oscillation of the drain-source voltage Vds continues due to self-excitation, even in the OFF interval where the gate signal is in the OFF state. In the case where the oscillation of the drain-source voltage Vds continues, there is a possibility that the switching operation of the switching element may be kept performed continuously without stopped, even in the OFF interval, resulting in that normal switching operation may not be performed.

First Example of the Present Invention

With reference to FIG. 9, an explanation will be provided as to the DC voltage Vdd and the drain-source voltage Vds according to the first example of the present invention. The present example described here is provided with the oscillation absorption circuit and the bypass capacitor of the present invention, indicating the case where the resistance R of the oscillation absorption circuit is assumed as 1.5Ω, and the bypass capacitor C is assumed as 1 µF, as described above.

Figure 9A:
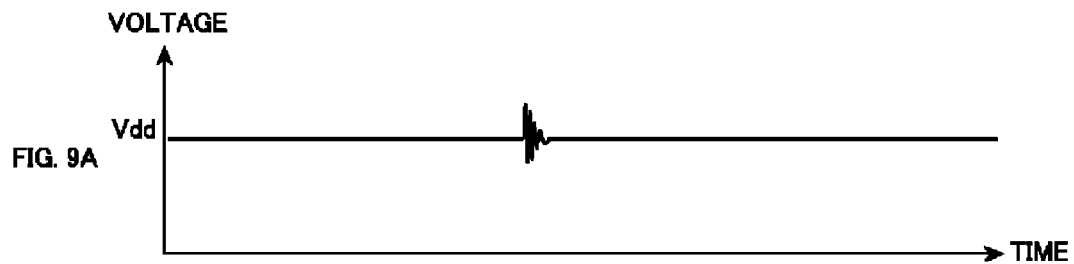
FIG. 9 illustrates the first embodiment of the present invention.
Figure 9B:
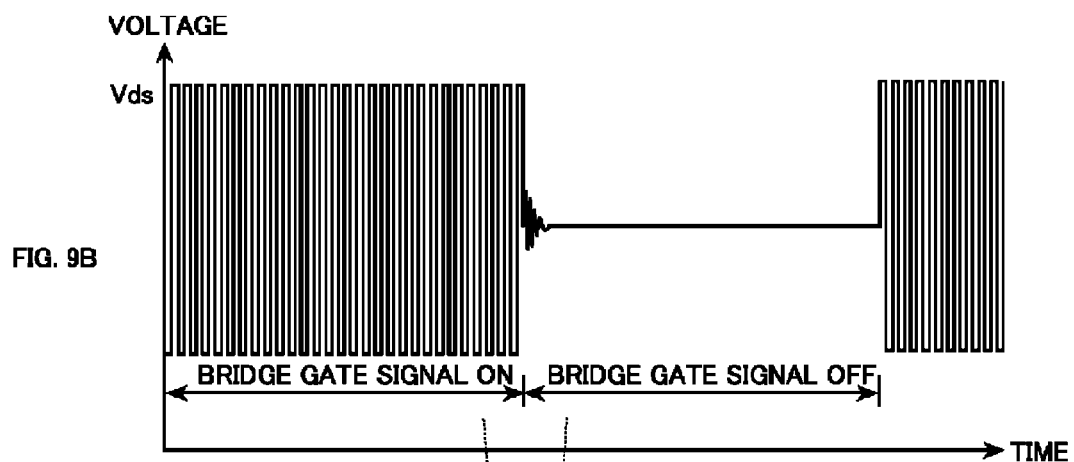
Figure 9C:
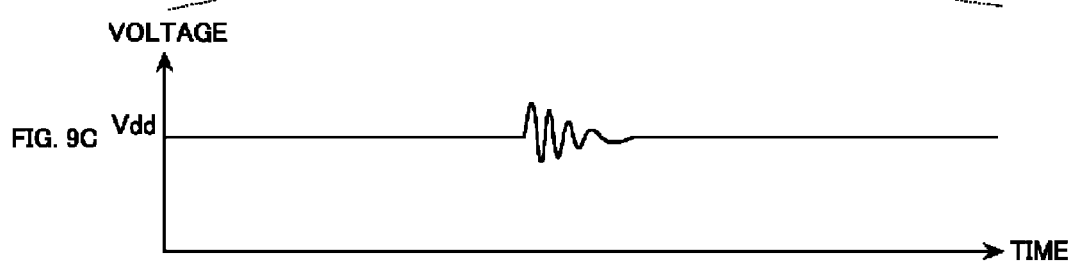
Figure 9D:
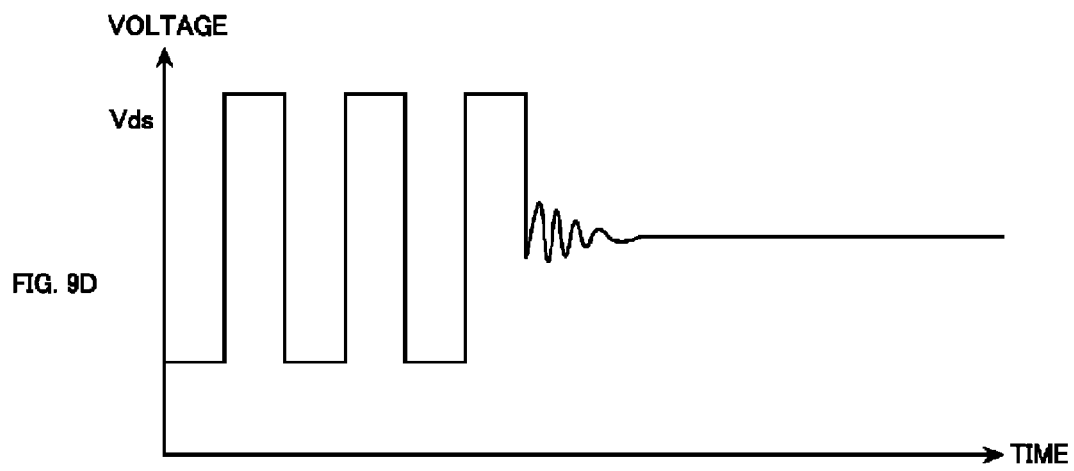
Figure 11:
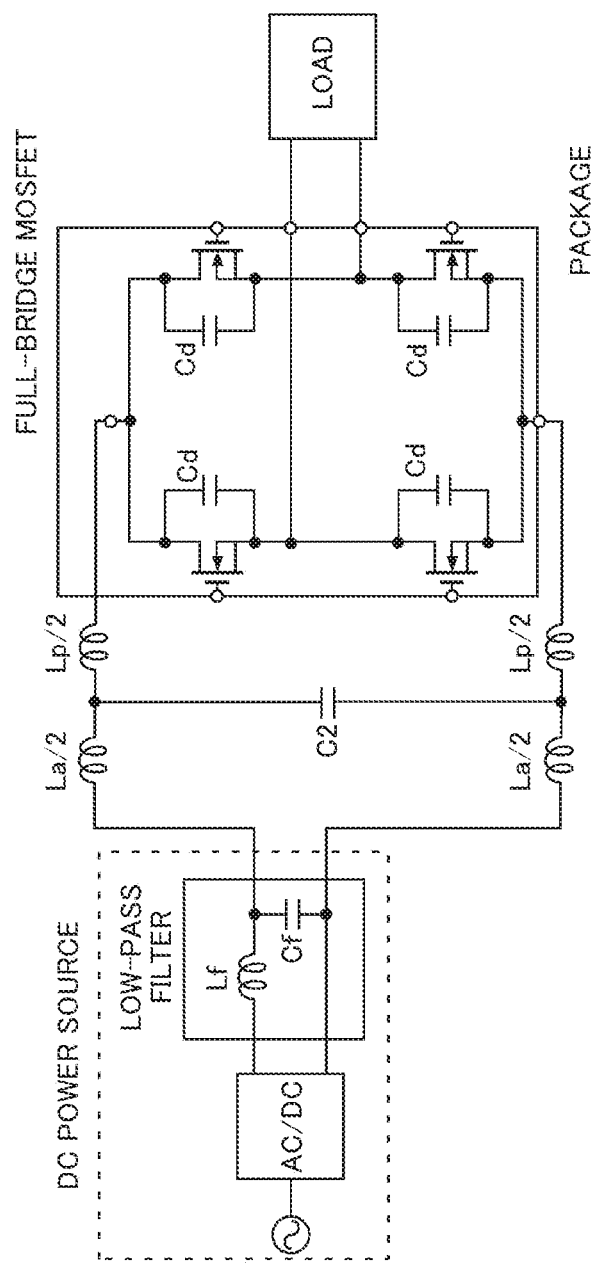
FIG. 11 illustrates a configuration example of the class-D amplifier circuit for an RF band, on the basis of a conventionally known bridge circuit configuration.
Figure 12A:
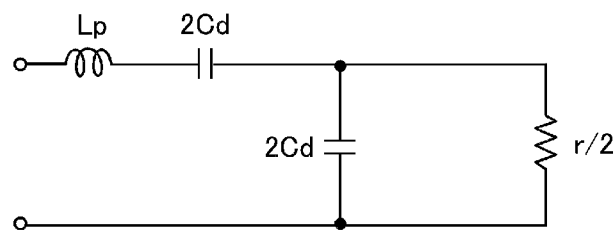
FIG. 12 illustrates the equivalent circuit of the class-D amplifier circuit, and schematically illustrates the drain-source voltage of the class-D amplifier circuit for a low RF range.
Figure 12B:
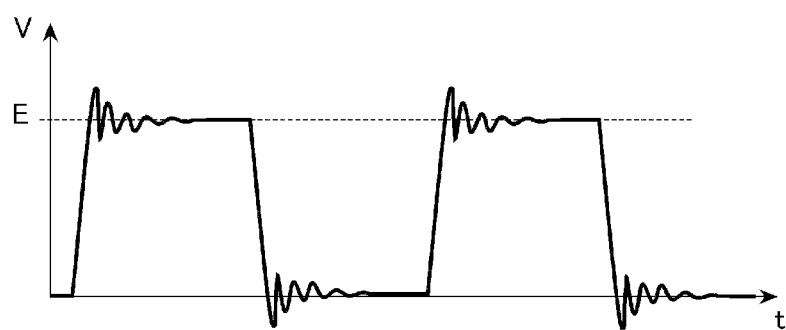
Figure 14A:
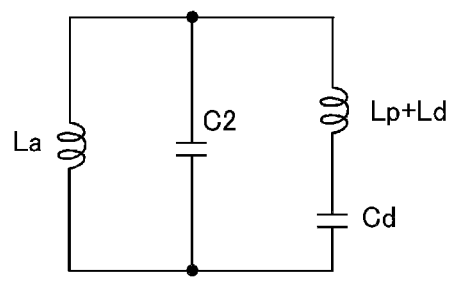
FIG. 14 illustrates the equivalent circuit of the class-D amplifier circuit for the high RF range, and schematically illustrates the drain-source voltage of the class-D amplifier circuit for the high RF range.
Figure 14B:
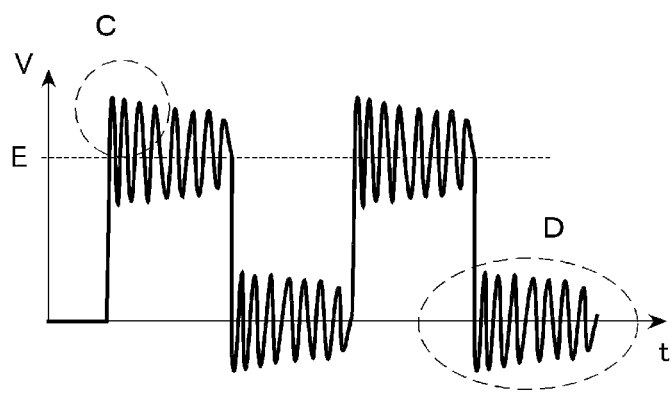
Figure 15:
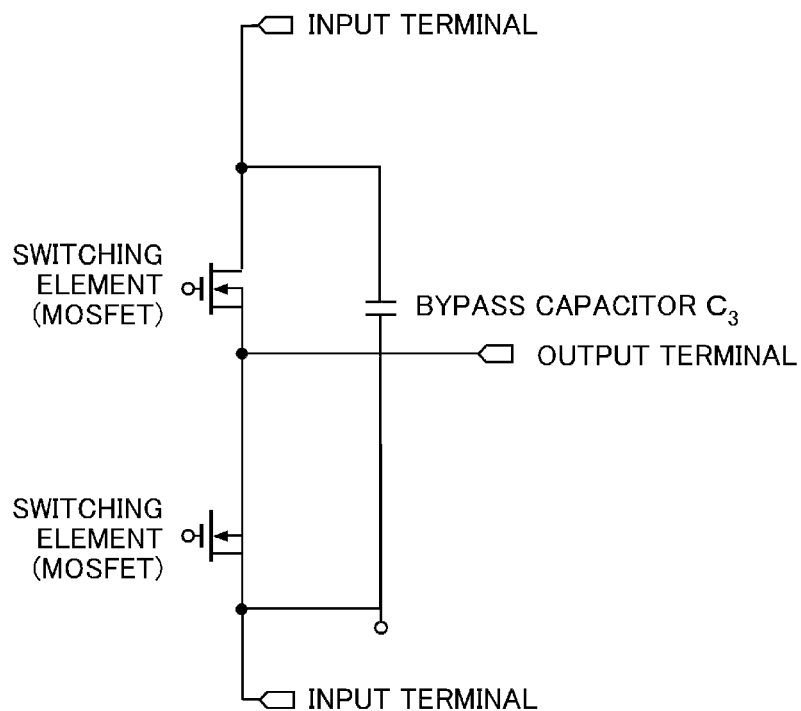
FIG. 15 illustrates a configuration example where the bypass capacitor is connected in parallel to the half-bridge circuit.

In the first example of the present invention, there are shown the DC voltage Vdd and the drain-source voltage Vds which are applied to the class-D amplifier circuit, FIG. 9A and FIG. 9C illustrate the DC voltage Vdd, FIG. 9B and FIG. 9D illustrate the drain-source voltage Vds, and FIG. 9C and FIG. 9D illustrate the state before and after the change of the gate signal from the ON state to the OFF state, on an enlarged scale. It is to be noted here that the cycle of the drive signals; rectangular signal and sine-wave signal as shown in FIG. 9, is illustrated schematically for the purpose of explanation, and it is not illustrated as an actual cycle.

The DC voltage Vdd indicates steady voltage during the ON interval where gate signal is applied to the bridge circuit, and after the gate signal is switched from the ON state to the OFF state, the oscillatory fluctuation occurs as shown in FIG. 9A and FIG. 9C, but the amplitude of the oscillation is smaller compared to the case of the conventional configuration, and the oscillation attenuates with a predetermined time constant.

During the ON interval where the gate signal is applied, a rectangular drive signal is applied to the switching element, and switching operation of the switching element is performed. When the drive signal is applied, the drain-source voltage Vds is illustrated as a rectangular periodic signal. After the gate signal is switched to the OFF state, application of the drive signal is suspended. When the drive signal is suspended, surge voltage is generated in the drain-source voltage Vds, but such generated surge voltage has smaller amplitude compared to the periodic signal that is generated in the conventional configuration, and this surge voltage attenuates with a predetermined time constant.

Accordingly, the oscillation of the drain-source voltage Vds does not continue and it is reduced. Then, during the OFF interval of the gate signal, the switching operation of the switching elements is stopped, and this allows normal switching operation to be performed.

Second Example of the Present Invention

With reference to FIG. 10, an explanation will be provided as to the DC voltage Vdd and the drain-source voltage Vds according to the second example of the present invention. In the present example described here, there are provided the oscillation absorption circuit and the bypass capacitor of the present invention, and as described above, there is illustrated the case where the resistance R of the oscillation absorption circuit is assumed as 1.5Ω, and the bypass capacitor C is assumed as 720 pF.

In the second example of the present invention, there are shown the DC voltage Vdd and the drain-source voltage Vds applied to the class-D amplifier circuit, FIG. 10A and FIG. 10C illustrate the DC voltage Vdd, FIG. 10B and FIG. 10D illustrate the drain-source voltage Vds, and FIG. 10C and FIG. 10D illustrate the state before and after the change of the gate signal from the ON state to the OFF state, on an enlarged scale. It is to be noted here that the cycle of the drive signals; rectangular signal and sine-wave signal as shown in FIG. 10, is illustrated schematically for the purpose of explanation, and it is not illustrated as an actual cycle.

The DC voltage Vdd indicates the steady voltage during the ON interval where the gate signal is applied to the bridge circuit, and after the gate signal is switched from the ON state to the OFF state, as shown in FIG. 10A and FIG. 10C, the amplitude of oscillation is smaller compared to the first example of the present invention, the oscillation attenuates with much smaller time constant, and it is stable.

During the ON interval where the gate signal is applied, a rectangular drive signal is applied to the switching element, and switching operation of the switching element is performed. When the drive signal is applied, the drain-source voltage Vds is illustrated as a rectangular periodic signal. After the gate signal is switched to the OFF state, application of the drive signal is suspended. When the drive signal is stopped, surge voltage is generated in the drain-source voltage Vds, but such generated surge voltage has smaller amplitude compared to the surge voltage in the first example of the present invention, and this surge voltage attenuates with a much smaller time constant.

Accordingly, the oscillation of the drain-source voltage Vds is further reduced compared to the case of the first example, and when the gate signal is in the OFF interval, the switching operation of the switching element is stopped, allowing the normal switching operation to be performed.

According to the first example and the second example of the present invention, in the class-D amplifier circuit to which the bypass capacitor is connected, the oscillation absorption circuit with a predetermined circuit constant is connected, thereby reducing the surge voltage and allowing the oscillation to attenuate effectively.

It is to be noted that the descriptions of the embodiments and modification examples as described above are just examples of the class-D amplifier relating to the present invention, and the present invention is not limited to each of those embodiments. It is to be understood that various changes may be made on the basis of the spirit of the present invention, and such changes will not depart from the scope of the present invention.

INDUSTRIAL APPLICABILITY

The class-D amplifier of the present invention is applicable to electric power supply to a plasma load, and it is also applicable to film formation equipment for producing a thin film such as semiconductor, liquid crystal, and solar panel, a laser oscillator, and the like.

EXPLANATION OF REFERENCES 1, 1A, 1B, 1C Class-D amplifier
2, 2A, 2B Class-D amplifier circuit
2a-2d Switching element
2e, 2f Capacitor
3, 3A, 3B Vibration absorption circuit
4 DC power source
4a AC source
4b Converter
4c Low-pass filter
5 Load
C Bypass capacitor
$C_2$, $C_3$ Bypass capacitor
Cd Capacitance
Cf Smoothing capacitor
$I_{AC}$ AC component
$I_{DC}$ DC component
$k_1$, $k_2$, $k_3$, $k_4$ Parameters
L Inductance
La Wiring inductance
Ld Wiring inductance
Lp Lead-wire inductance
r Switching loss
R Resistance
Vdd DC voltage
Vds Drain-source voltage
$\zeta$ Attenuation coefficient
$\omega$ Drive frequency
$\omega n$ Resonance frequency
$\omega m$ Resonance frequency
$\omega o$ Resonance frequency

What is claimed is:

1. A class-D amplifier comprising,
a class-D amplifier circuit incorporating in a package, a bridge circuit comprising at least one series circuit of switching elements, and a bypass capacitor being connected in parallel to the series circuit of the switching elements, and
an oscillation absorption circuit being connected to a power input terminal of the class-D amplifier circuit,
the oscillation absorption circuit being configured by an RL parallel circuit of resistance and inductance, and
the resistance of the oscillation absorption circuit constituting damping resistance in an oscillation circuit that is made up of the oscillation absorption circuit and the class-D amplifier circuit, and
a value of the resistance configuring the oscillation absorption circuit is set, using a value of the bypass capacitor as a parameter.

2. The class-D amplifier according to claim 1, wherein,
the value of the resistance configuring the oscillation absorption circuit is based on a value obtained by dividing a product of an attenuation coefficient and a resonance frequency, by a value of the bypass capacitor, in the oscillation circuit being a second order oscillation system that is represented by a parallel circuit, incorporating the resistance of the oscillation absorption circuit, the bypass capacitor, and a wiring impedance made up of a series circuit of wiring inductance and capacitance of the switching element, and
a value of the resonance frequency of the oscillation circuit corresponds to a reciprocal value of the square root of the product of the wiring inductance and the capacitance of the switching element, constituting the wiring impedance of each arm in the bridge circuit.

3. The class-D amplifier according to claim 1, wherein, the bridge circuit is either of a half bridge circuit made up of a series circuit of two switching elements, and a full bridge circuit formed by connecting in parallel, the series circuits each including two switching elements.

4. The class-D amplifier according to claim 2, wherein, the bridge circuit is either of a half bridge circuit made up of a series circuit of two switching elements, and a full bridge circuit formed by connecting in parallel, the series circuits each including two switching elements.

* * * * *